(12) United States Patent
Nussbaum et al.

(10) Patent No.: US 11,166,106 B2
(45) Date of Patent: Nov. 2, 2021

(54) HIGH OUTPUT IMPEDANCE AUDIO AMPLIFIER FOR NOISE REJECTION

(71) Applicant: Apple Inc., Cupertino, CA (US)

(72) Inventors: Michael B. Nussbaum, Santa Cruz, CA (US); Roderick B. Hogan, San Francisco, CA (US); Todd K. Moyer, Portland, OR (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/889,630

(22) Filed: Jun. 1, 2020

(65) Prior Publication Data
US 2020/0351593 A1 Nov. 5, 2020

Related U.S. Application Data

(62) Division of application No. 16/144,218, filed on Sep. 27, 2018, now Pat. No. 10,674,280.

(51) Int. Cl.
*H04R 9/06* (2006.01)
*H03F 3/217* (2006.01)
*H03K 19/094* (2006.01)
*H04R 1/10* (2006.01)
*H03K 5/156* (2006.01)

(52) U.S. Cl.
CPC ............. *H04R 9/063* (2013.01); *H03F 3/217* (2013.01); *H03K 5/1565* (2013.01); *H03K 19/094* (2013.01); *H04R 1/1075* (2013.01); *H04R 2420/07* (2013.01)

(58) Field of Classification Search
CPC ..... H03F 3/217; H04R 2420/07; H04R 9/063; H04R 1/1075; H03K 5/1565; H03K 19/094
USPC ........................................................ 381/120
See application file for complete search history.

(56) References Cited

U.S. PATENT DOCUMENTS

2016/0065134 A1* 3/2016 Lu ........................... H03F 1/523
330/251

OTHER PUBLICATIONS

"Current vs. Voltage when driving headphones?," Headphone Reviews and Discussion, retrieved from the Internet <http://www.head-fi.org/threads/current-vs-voltage-when-driving-headphones.456576/>, Oct. 30, 2021, 9 pages.

\* cited by examiner

*Primary Examiner* — Paul Kim
(74) *Attorney, Agent, or Firm* — Womble Bond Dickinson (US) LLP (57) ABSTRACT

A hearable has an audio amplifier circuit coupled to a speaker as a load. The amplifier circuit has current source drive, which attenuates electromagnetically coupled noise of the speaker. In other instances, the amplifier circuit has a first amplifier mode and a second amplifier mode, wherein in the first amplifier mode the amplifier circuit becomes configured to drive the speaker as a voltage source, and in the second amplifier mode the amplifier circuit becomes configured to drive the speaker as a current source. Control logic varies the amplifier circuit between i) the first amplifier mode for larger amplitudes of the audio signal, and ii) the second amplifier mode for smaller amplitudes of the audio signal. Other aspects are also described and claimed.

16 Claims, 5 Drawing Sheets

HIGH OUTPUT IMPEDANCE AUDIO AMPLIFIER FOR NOISE REJECTION

This application is a divisional of pending U.S. patent application Ser. No. 16/144,218 filed Sep. 27, 2018.

An aspect of the disclosure here relates to audio amplifiers, more specifically to class D audio amplifiers. Other aspects are also described.

BACKGROUND

There are many types of audio amplifiers, including class A, class B, class AB linear amplifiers, and class D also known as switching amplifiers. Each type has many variations with different types of transistors, and there are trade-offs in efficiency, distortion, power levels and noise immunity or rejection for various types of noise. Miniaturization of audio amplifiers and speakers for earbuds imposes specialized constraints for power management, efficiency, size, and operation in environments with electromagnetically coupled noise.

SUMMARY

An audio amplifier circuit is described that is configured as a current source amplifier with high output impedance. The amplifier circuit receives an audio signal and drives a speaker as a load. The amplifier circuit has a first amplifier mode and a second amplifier mode. In the first amplifier mode, the amplifier circuit becomes configured to drive the speaker as a voltage source. In the second amplifier mode the amplifier circuit becomes configured to drive the speaker as a current source. Control logic varies the amplifier circuit between the first amplifier mode for larger amplitudes of the audio signal, and the second amplifier mode for smaller amplitudes of the audio signal. This may yield a solution that exhibits less audible noise during low volume listening, and adequate output power during high volume listening, which may be particularly desirable in hearables such as earbuds.

In another aspect of the disclosure, a hearable housing (e.g., an earbud housing) has an audio amplifier circuit that is coupled to an earbud speaker as a load. The amplifier circuit has current source drive to drive the earbud speaker. In such a configuration, the amplifier circuit has higher output impedance which advantageously attenuates electromagnetically coupled noise of the earbud speaker, relative to an audio amplifier circuit that has voltage source drive and therefore lower output impedance.

A method of operating an audio amplifier to drive a speaker is disclosed. In the method, the speaker is driven as a load, from an amplifier circuit. The amplifier circuit is configured into a first amplifier mode in which the speaker is driven using voltage source drive with lower output impedance, for larger amplitudes of audio signal. The amplifier circuit is configured into a second amplifier mode in which the speaker is driven using current source drive with higher output impedance, for smaller amplitudes of the audio signal.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

Several aspects of the disclosure here are illustrated by way of example and not by way of limitation in the figures of the accompanying drawings in which like references indicate similar elements. It should be noted that references to "an" or "one" aspect in this disclosure are not necessarily to the same aspect, and they mean at least one. Also, in the interest of conciseness and reducing the total number of figures, a given figure may be used to illustrate the features of more than one aspect of the disclosure, and not all elements in the figure may be required for a given aspect.

DETAILED DESCRIPTION

Several aspects of the disclosure with reference to the appended drawings are now explained. Whenever the shapes, relative positions and other aspects of the parts described are not explicitly defined, the scope of the invention is not limited only to the parts shown, which are meant merely for the purpose of illustration. Also, while numerous details are set forth, it is understood that some aspects of the disclosure may be practiced without these details. In other instances, well-known circuits, structures, and techniques have not been shown in detail so as not to obscure the understanding of this description.

Wires and speakers in audio systems, and especially miniaturized ones in earbuds, are susceptible to electromagnetically coupled noise from nearby electronic equipment. For example, a speaker that is inside of a housing, such as an earbud housing, can pick up noise from a wireless radio subsystem, e.g., a Bluetooth subsystem, that is also inside the housing (this may be referred to as self-interference). It is a goal of the audio amplifiers and operation thereof described herein, and variants thereof, to decrease or better reject such noise. An audio amplifier with current drive and higher output impedance is found to attenuate noise that is modeled as a voltage source in the signal path from the amplifier output to the transducer (speaker). One version of such an audio amplifier is an H bridge operated as a class D amplifier with pulse width modulation (PWM) timing that features a charge delivering pulse and longer inactive time, to yield a higher output impedance for the amplifier. In one variation, the amplifier has different operating modes for larger amplitude signals vs. smaller amplitude signals, featuring higher output impedance current drive for the smaller amplitude signals where the noise is more objectionable, and lower output impedance voltage drive for the larger amplitude signals where higher output voltage amplitude is required.

Figure 1:
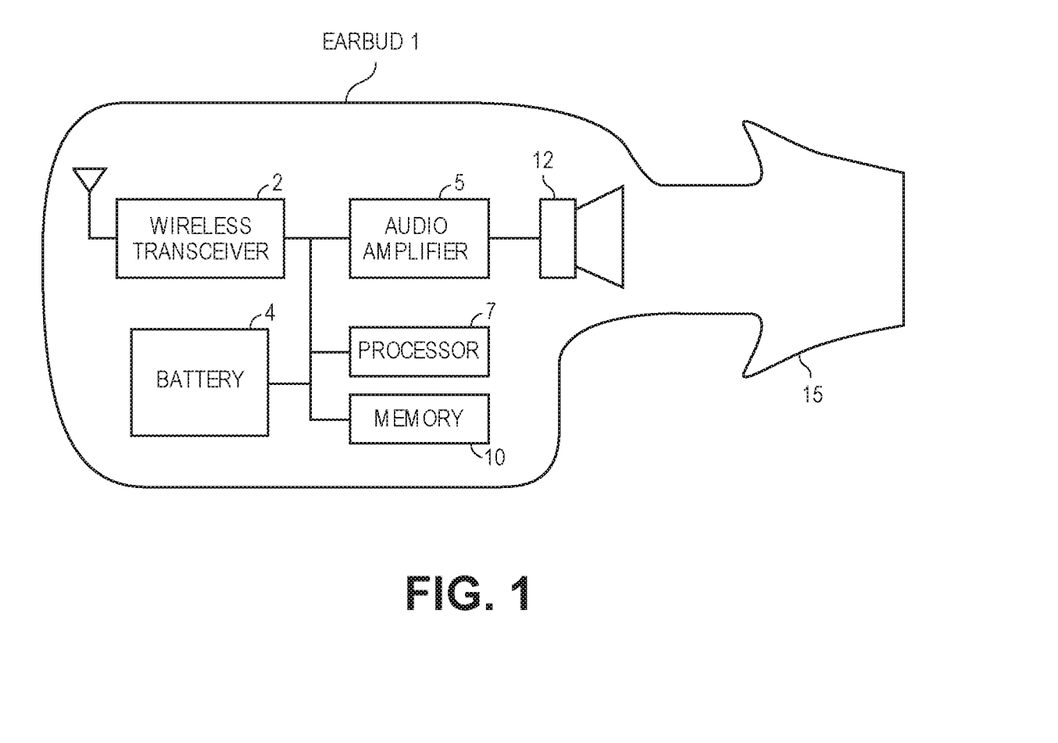
FIG. 1 depicts an earbud that includes an audio amplifier and a speaker and can implement aspects of an amplifier circuit described with reference to FIGS. 2-6 for attenuation or rejection of noise.

The audio amplifiers described here may be especially useful to attenuate audible noise that may be more likely to appear in personal electronic devices referred to as hearables, which include hearing aids, headsets and especially earbuds, and personal sound amplification products. As an example of such applications, FIG. 1 depicts an earbud 1 that includes an audio amplifier 5 and a speaker 12 and can implement aspects of the amplifier circuit described with reference to FIGS. 2-6 for attenuation or rejection of noise. A wireless transceiver 2 communicates with another electronic device and receives an audio signal, for example digitally encoded. A processor 7 with memory 10 receives the digitally encoded audio signal from the wireless transceiver 2, processes the audio signal (e.g., decodes and enhances it for improved sound) and forwards the signal to the audio amplifier 5. The amplified audio signal at the output of the audio amplifier drives the speaker 12, producing sound heard through an earpiece 15 of the earbud 1, for listening by a user wearing the earbud 1. A battery 4 supplies electrical power for the system. Other aspects such as a charging port for the battery 4, one or more input controls (e.g., a button, a tap sensor), etc., are readily envisioned and implemented.

Figure 2:
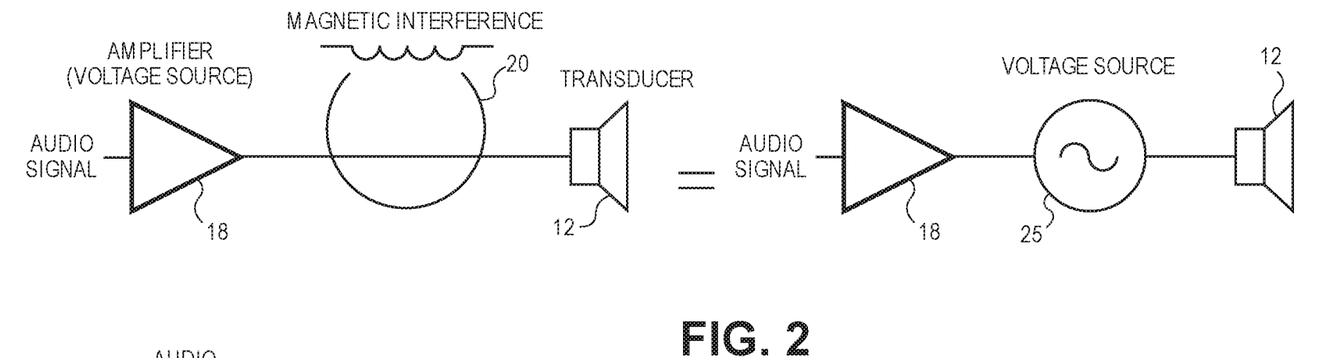
FIG. 2 depicts interference with a conventional audio amplifier, that produces audible noise in a transducer and is modeled as a voltage source.

FIG. 2 depicts interference 20 that produces audible noise in the speaker 12 when a conventional voltage source type or low output impedance amplifier 18 is driving the speaker 12. The interference 20 is modeled as a voltage source 25 in the path of the amplified audio signal as shown. Such interference 20 may be due to audio-frequency magnetic fields that electromagnetically couple into the wires of the path or directly into for example a voice coil inside the speaker 12 and are reproduced as humanly audible sound waves by the speaker. For example, currents feeding radio frequency (RF) and sensor processing subsystems inside the earbud housing can cause electromagnetic fields with frequencies in the audio frequency range, which can induce audible noise in the nearby speaker. A solution to this problem, in amplifier circuits described herein and variations thereof is to have a current source driver that because of its high output impedance attenuates the noise currents contributed by the voltage source 25. In other words, the current source driver absorbs much of the noise voltage resulting from the coupling. In some versions, current source drive results in different frequency response than voltage drive, and is accounted for in an equalization operation that may be performed upon the digital audio signal by the processor 7 in FIG. 1, or upon a digital or analog version of the audio signal by a portion of the audio amplifier 5.

Figure 3:
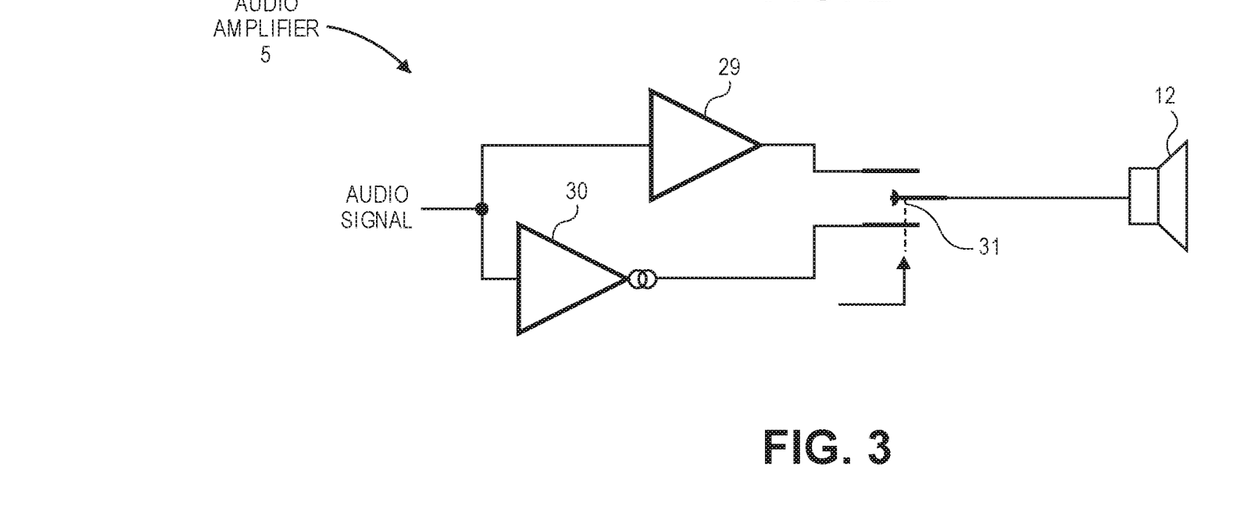
FIG. 3 depicts an audio amplifier that switches between voltage drive and current drive.

FIG. 3 depicts conceptually the amplifier 5 which is reconfigurable or switches between voltage source drive and current source drive. One version has a voltage source amplifier 29 that has voltage drive, and another separate amplifier, current source amplifier 30 that has current drive, with a switch 31 that switches back and forth between the two amplifiers. In another version, the two amplifiers 29, 31 and the switch 31 are somewhat integrated with each other (the two amplifiers are not strictly speaking separate but nevertheless they together enable the amplifier 5 to operate in voltage drive mode and current drive mode (alternately, or one at a time), with the switch 31 representing the selection between those modes.

Since the noise or interference 20, described above with reference to FIG. 2, is primarily audible at low playback volumes, the current drive amplifier is selected at low playback volumes or during small amplitude segments of an audio signal. And since a voltage drive amplifier can produce a higher voltage amplitude output signal, needed for higher playback volumes, more efficiently than the current drive amplifier, it is automatically selected at high playback volumes or during large amplitude segments of the audio signal. In other words, the amplifier 5 is operated in voltage drive mode (or as a voltage drive amplifier) whenever the audio signal has large amplitudes, and in current drive mode (or as a current drive amplifier) whenever the audio signal has small amplitudes. The combination of voltage drive mode and current drive mode, or voltage drive amplifier and current drive amplifier, allows for a combined operating efficiency that may be especially suitable for miniaturization in a battery-operated earbud 1.

Figure 4:
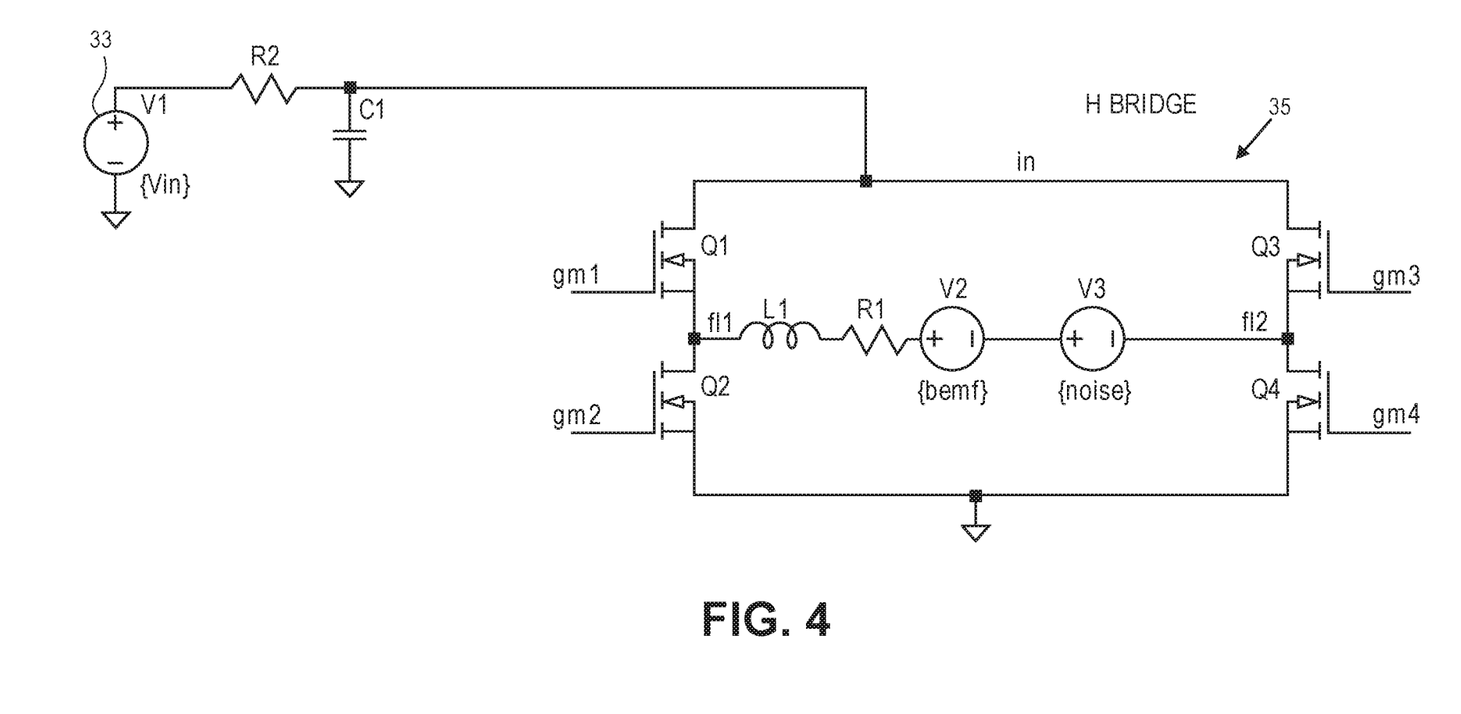
FIG. 4 is a circuit diagram of an H bridge that can be operated as part of a class D amplifier in the earbud of FIG. 1, to attenuate or reject noise modeled as a voltage source, and also overcome back electromotive force.

FIG. 4 is a circuit diagram of an example of the audio amplifier 5, being a H bridge 35 that is operated as a class D amplifier and in both voltage and current drives modes so as to attenuate or reject noise (e.g., modeled as the voltage source 25 in FIG. 2), and also overcome back electromotive force of the speaker 12 which is a load of the amplifier 5. H bridge 35, in one version, has four transistor switches, herein shown as metal oxide semiconductor field effect transistors, MOSFETs, transistors Q1, Q2, Q3, and Q4, with the speaker 12 (load) coupled to the transistors as the crossbar of the "H". The speaker 12 in this example is modeled as resistor R1 in series with inductor L1 (e.g., a voice coil), the induced noise {noise} is modeled as voltage source V3, and back electromotive force {bemf} is modeled as voltage source V2. This 'bemf' is a consequence of the movement of the speaker. For the low audio case it may be a negligible term. Power supply 33 is modeled as voltage source V1 with source resistance R2 and output capacitance C1. When the transistors Q1-Q4 are operated with the control signal timing shown in FIGS. 5 and 6, and variations thereof, the H bridge 35 can drive either a voltage across the load (voltage drive) or a current through the load (current drive), as further described below. This circuit can be operated as either a voltage source or a current source, depending on how the switches Q1, Q2, Q3, and Q4 are controlled.

Figure 5:
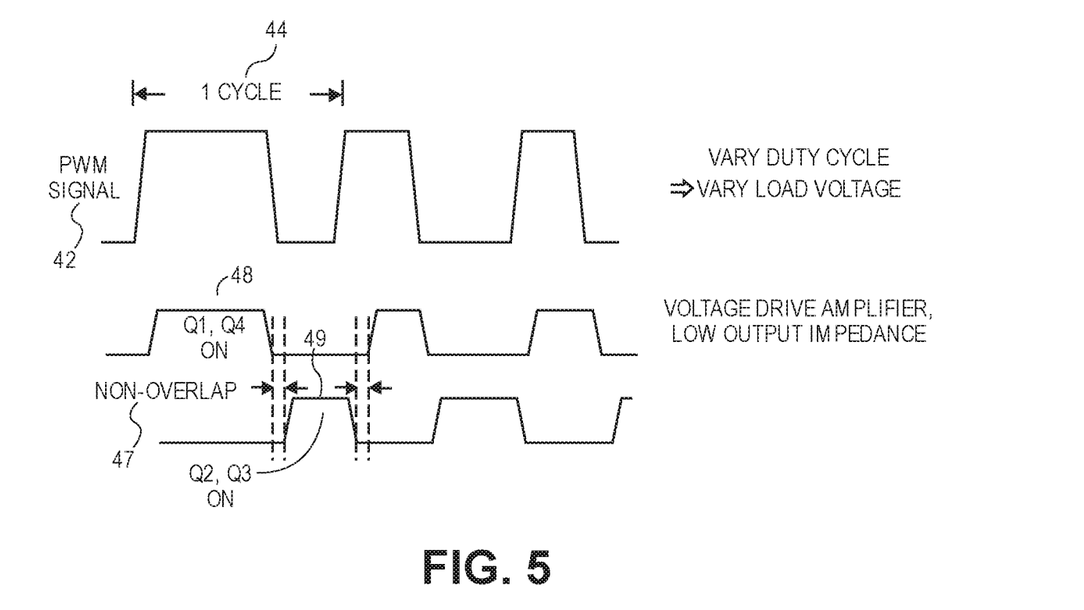
FIG. 5 is a timing diagram showing a pulse width modulation signal that is varied to vary a load voltage, in a voltage drive amplifier with low output impedance.

FIG. 5 is a timing diagram showing a pulse width modulation, PWM, signal that is varied to vary a load voltage, in a voltage drive amplifier with low output impedance. The PWM signal may be generated by the processor 7 of FIG. 1 or by an amplifier driver circuit (not shown), based on the audio signal to be amplified (the duty cycle varies in accordance with the amplitude of the audio signal.) The PWM signal 42 is varied in duty cycle (as per the audio signal), which varies the voltage applied across the load (speaker 12), i.e., the load voltage f1 to f2 in FIG. 4. Increasing the duty cycle (longer positive interval, 48, shorter negative interval, 49) of the PWM signal 42 translates to increased load voltage, while decreasing the duty cycle (shorter positive, longer negative interval) leads to decreased load voltage.

In FIG. 5, the positive phase (high, positive or one level) of the pulse width modulation signal 42 produces the on time or activation control pulse 48 for transistors Q1 and Q4 and drives a voltage of one polarity across the load. The negative phase (low, negative or zero level) of the pulse width modulation signal 42 produces the on time or activation control pulse 49 for transistors Q2 and Q3 (the transistor switches are closed) and drives a voltage of the opposing polarity across the load. Generally, the transistor control signals should be produced with a non-overlap time 47, so that at no time are both transistors in one side of the H, e.g., Q1 and Q2, or Q3 and Q4, on at the same time, and shoot through current is avoided. But, because the non-overlap time 47 is small relative to the active time of either of the transistor control signals, one diagonally opposed pair of transistors, e.g., Q1 and Q4 or Q2 and Q3 is active most of the time, and the output impedance of the H bridge 35 is therefore very low, near zero. Operated in this manner, the H bridge 35 is a low output impedance amplifier, also referred to here as voltage drive or voltage source amplifier. A reason why the voltage mode can drive higher signal levels at greater efficiency than current mode (able to produce large amplitude signals to drive the speaker 12 at the f1, f2 nodes) is that in the voltage mode, the switches (transistors Q1-Q4) are active during more of each cycle. Wrapping current feedback around the circuit to achieve a current source would also yield get the same amplitude but that solution would consume more power (for the control and current feedback). On a related note, the current source drive described herein will be less efficient than the voltage source drive at comparable signal levels, because it will experience a higher RMS current. Accordingly, in some versions of the earbud 1 of FIG. 1, the H bridge 35 of FIG. 4 is operated in the voltage drive mode (or as a voltage source amplifier) with low output impedance configuration achieved using timing shown in FIG. 5, for larger amplitude audio signals. The H bridge 35 can also be operated in a current drive mode (or as a current source amplifier), which exhibits high output impedance, using the transistor control timing shown in FIG. 6. That mode may be reserved for smaller amplitude audio signals.

Figure 6:
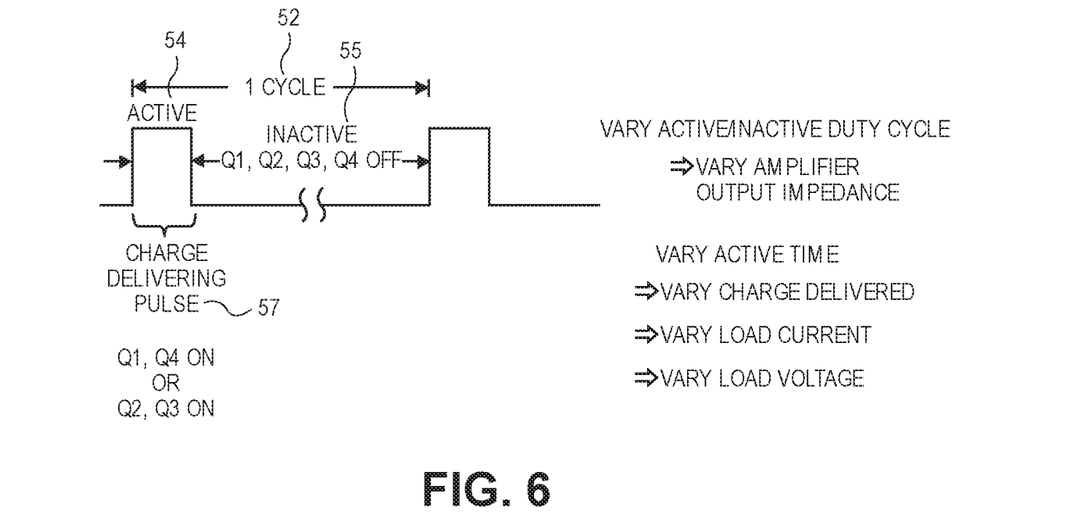
FIG. 6 is a timing diagram showing a pulse width modulation signal with a long inactive time, for controlling amplifier output impedance in a current drive amplifier with higher output impedance than the voltage drive amplifier.

FIG. 6 is a timing diagram showing a pulse width modulation signal with a long inactive time, i.e. when all of the transistors are off (they are switches that are all open), which is used to create high output impedance. This figure illustrates how the transistors Q1-Q4 of the H bridge 35 are driven differently than in FIG. 5 (when amplifying the audio signal) so as to achieve current drive mode (current source amplifier). The active time 54 comprises a number of possible switch states, namely at least two switch states, and optionally three switch states. These switch states and the resulting load current waveform may be described as follows in connection with FIG. 7 described next.

Figure 7:
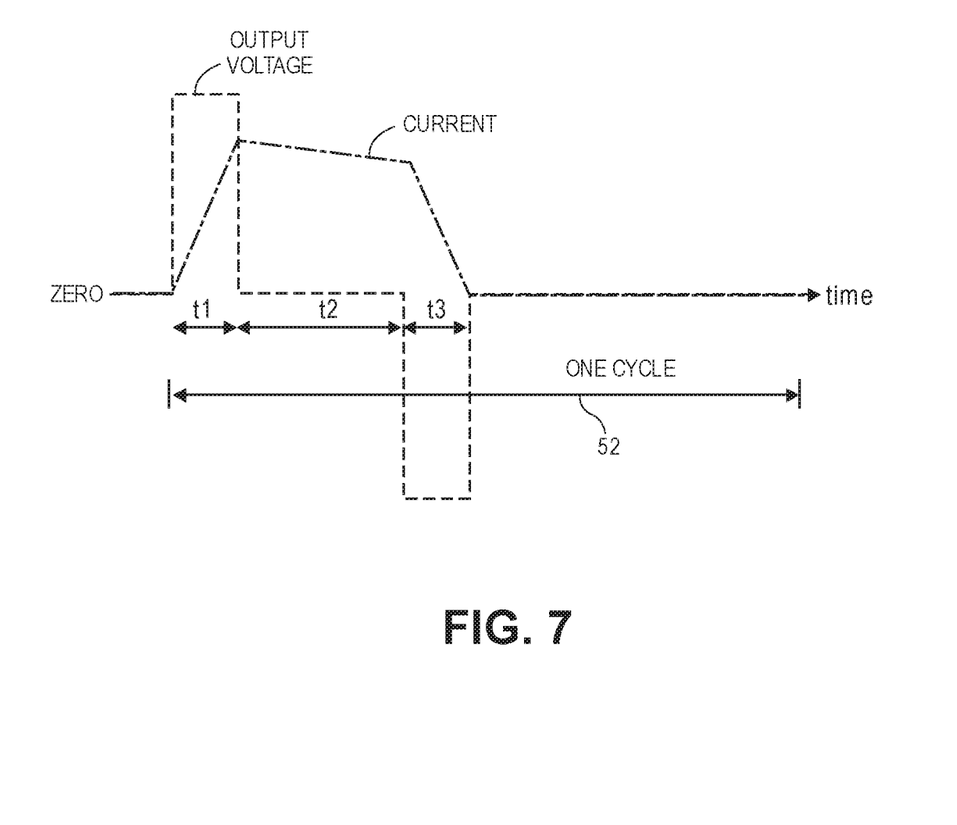
FIG. 7 shows an example of a load current pulse, used to describe various switch states of an H bridge being operated in discontinuous mode.

Whereas in FIG. 5 the transistors of the H bridge 35 are operated or controlled in a so-called "continuous mode" (borrowed from switching power supply terminology) to achieve low output impedance (voltage source amplifier), in FIG. 6 they are being operated in "discontinuous mode". This is also shown in FIG. 7. In the discontinuous mode of operation shown in FIG. 7, there is a desired amount of charge Q to be delivered to the load during each cycle period 52, which charge may be viewed as the integral of the load current. In one instance, the proposed system is to deliver the charge Q in a current pulse (charger delivering pulse 57) that has a smaller duration than the sampling interval (cycle period 52), namely during an active time 54. An example of this current pulse during the active time 54 is as follows: during t1, the load current initially rises rapidly when Q1 and Q4 are on (and Q2 and Q3 are off); then during t2 it falls slowly when Q2 and Q4 are on (and Q1 and Q3 are off); and then during t3 it falls rapidly when Q2 and Q3 are on (and Q1 and Q4 are off). Then, once the load current has fallen back down to zero, Q1-Q4 are turned off (also referred to here as an output stage that is in a tri-state condition) during the rest of the sampling interval (cycle period 52). The active time 54 is followed immediately by an inactive time 55 (in a single cycle period 52), during which all transistors Q1, Q2, Q3 and Q4 of the H bridge 35 are off (transistor switches are open). This inactive time 55 is much longer than the non-overlap time 47, for voltage drive low impedance operation of the H bridge 35 depicted in FIG. 5. Because the transistors Q1, Q2, Q3 and Q4 of the H bridge 35 are off most of the time (in each cycle time 52), the output impedance of the amplifier is very high, and is representative of current drive (high output impedance) operation, much higher than is obtained in the continuous mode operation depicted in FIG. 5.

By varying the ratio of the active time 54 to the inactive time 55, i.e., the active/inactive duty cycle, the amplifier output impedance can be varied (when using the discontinuous mode of operation in which all of Q1-Q4 are turned off during the inactive time). More specifically, the timing of t1, t2 and t3 may be calculated in closed form, there is a degree of freedom between t1 and t2 which enables the creation of pulses that are narrower (e.g., minimum width being when t2=0) or wider (maximum width when t3=0). This allows a trade between noise attenuation vs. power dissipation. Reducing the duty cycle leads to higher output impedance, and vice versa. By varying the active time 54, and selection of which diagonally opposed pair of transistors of the H bridge 35 is on (from one PWM cycle to the next), the amount and direction of charge delivered to the load is varied, and correspondingly the load current and load voltage are varied. The processor 7 or other control logic does so, in order to produce a desired amplification of the audio signal in the speaker 12 and corresponding acoustic waves, i.e., sound, that follow the original audio signal. With the audio signal thus delivered to the speaker 12 from a current drive (or current source) amplifier, the electromagnetically coupled noise is suppressed or attenuated, and the listener has an improved audio listening experience. Viewed another way, during the inactive state with all the transistors off, any noise voltage induced in the circuit by electromagnetic fields is unable to drive any current through the voicecoil, so there is no audible noise. Noise current can flow during the active interval, but the resulting noise is attenuated by the ratio of inactive to active time. Changing to a voltage drive (or voltage source) amplifier when the audio signal amplitude is above a certain threshold maintains the desired listening experience, without suffering the lower power efficiency of the current drive.

There are several ways to implement a modulator circuit that controls the on-off timing of the switches (transistors Q1-Q4), to achieve the desired pulse waveforms such as the one shown in FIG. 7. One example is a constant switching frequency controller that calculates a custom pulse for each switching period based on the input current command (which it converts into a charge command and computes t1 and t2 between the extremes noted above). In one variation of such a controller, there may be a constraint added to keep the duty cycle constant which helps keep effective output impedance constant (thereby preventing variation in frequency response of the audio amplifier). In another variation, a single pre-designed pulse delivers a known charge q, and the controller integrates the input current command until a charge Q<=q is accumulated, at which pint a single pulse is delivered to the load. This may result in a lower switching frequency at lower current commands. In yet another variation, the controller has multiple predesigned pulses which deliver a range of known charges—the controller integrates the incoming current command until a charge Q>=q is accumulated, at which point a single pulse is delivered to the load. The availability of such a range of pulses allows the controller to operate in a range of bounded maximum and minimum switching frequencies.

Also, in addition to the three switching states described above (t1, t2, t3), a fourth switching state may be needed in some instances after t3, to damp any resonance in the system (e.g., by turning on either both of the high side switches (transistors Q1, Q3) or both of the low sides switches (transistors Q2, Q4) for a short period of time. Finally, it should be noted that the switching state t2 may be accomplished by either having both low side switches (transistors Q2, Q4) on, or both high side switches (transistors Q1, Q3) on.

With reference to FIGS. 4, 5 and 6, there are many possible versions of the amplifier circuit and its operation. Other types of transistors, such as PMOS, CMOS, bipolar, biMOS, biCMOS, etc., can be used in building an H bridge. Other types of class D amplifiers could be used. The cycle time 44 of pulse width modulation signal 42, or the cycle time 52 of the charge delivering pulse 57, i.e., the inverse of the repetition rate, could be in the microsecond range, for a cycle time or repetition rate in the megahertz range, and audio signals being amplified through the class D amplifier. Active/inactive duty cycle for the timing of FIG. 6 could be varied continuously, or in two (or more) distinct states. A single H bridge could be operated according to the timing of FIG. 5, and the timing of FIG. 6, one at a time, as needed for voltage drive and current drive modes. Alternatively, there may be two H-bridges, one that is always operated according to the timing of FIG. 5 and is used only during voltage drive mode, and another that is operated only according to the timing of FIG. 6 and is used only during current drive mode.

In one version, the processor 7 or other control logic could have predetermined pulse widths stored in memory, and may select from among them to deliver an amount of charge to the load in each charge-delivering current pulse. The system could apply error reduction over time, for charge-delivering current pulses in accordance with the audio signal, for example by sensing load voltage or current and comparing to the original audio signal. This is one way to determine control signals for the transistors in the H bridge according to amount of charge to be delivered in each charge-delivering current pulse. Another way is to determine the control signals on the fly, shaping each individual pulse width rather than selecting from predetermined pulse widths. Depending on accuracy, error reduction over time might not be needed. A Sigma Delta modulator could be used in some versions. A variable power supply and timing could be used to produce shorter, wider pulses, or taller, narrower pulses. In some versions, shorter, wider pulses are preferred for greater efficiency inverse to RMS current.

Operation techniques and circuits described herein are especially well-suited for earbud speakers, because the small, low mass components in this size speaker are especially susceptible to audio reproduction of electromagnetically coupled noise. But, these techniques and circuits could also be applicable to other sizes and types of speakers in further audio systems.

While certain aspects have been described and shown in the accompanying drawings, it is to be understood that such are merely illustrative of and not restrictive on the broad invention, and that the invention is not limited to the specific constructions and arrangements shown and described, since various other modifications may occur to those of ordinary skill in the art. For example, while FIG. 1 depicts a device in which an audio amplifier and speaker are included in a wireless earbud, it is also possible to have other types of hearables, other types of speakers, other types of transducers, and other types of audio systems benefit from the techniques described above. The description is thus to be regarded as illustrative instead of limiting. To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An audio amplifier comprising:
    an amplifier circuit to couple to an earbud speaker as a load; and
    the amplifier circuit having current source drive to couple to the earbud speaker, wherein the amplifier circuit has the current source drive in a first amplifier mode for smaller amplitudes of an audio signal, and wherein the amplifier circuit has a second amplifier mode for larger amplitudes of the audio signal, and wherein output impedance of the amplifier circuit in the second amplifier mode is lower than in the first amplifier mode.

2. The audio amplifier of claim 1, wherein the amplifier circuit comprises a transistor-based H bridge as a class D amplifier.

3. The audio amplifier of claim 1, wherein:
    electromagnetically coupled noise of the earbud speaker is attenuated relative to the smaller amplitudes of the audio signal.

4. The audio amplifier of claim 1, further comprising:
    control logic, to control transistors in a transistor-based H bridge as the amplifier circuit, in a discontinuous operation with charge-delivering current pulses.

5. The audio amplifier of claim 1, further comprising:
    control logic, to control transistors in a transistor-based H bridge as the amplifier circuit, to vary magnitude of current and charge to deliver to the earbud speaker in accordance with the audio signal; and
    the control logic further to control a duty cycle of charge-delivering current pulses relative to a repetition rate of the charge-delivering current pulses, to control effective output impedance of the transistor-based H bridge, and to set the duty cycle lower with associated higher output impedance of the transistor-based H bridge for smaller amplitudes of the audio signal and the duty cycle higher with associated lower output impedance for larger amplitudes of the audio signal.

6. The audio amplifier of claim 1, further comprising:
    control logic, to determine an amount of charge to be delivered by a transistor-based H bridge, as the amplifier circuit, to the earbud speaker in each charge-delivering current pulse;
    the control logic to select from a plurality of predetermined pulses in accordance with the determined amount of charge; and
    the control logic to perform error reduction over time, for charge-delivering current pulses, in accordance with the audio signal.

7. A method of operating an audio amplifier to drive an earbud speaker, the method comprising:
    driving an earbud speaker as a load, by a current source drive of an amplifier circuit wherein the amplifier circuit has the current source drive in a first amplifier mode for smaller amplitudes of an audio signal; and
    reconfiguring the amplifier circuit to have a voltage source drive; and
    driving the earbud speaker as a load, by the voltage source drive of the amplifier circuit wherein the amplifier circuit has the voltage source drive in a second amplifier mode for larger amplitudes of the audio signal, and output impedance of the amplifier circuit in the second amplifier mode is lower than in the first amplifier mode.

8. The method of claim 7 wherein the amplifier circuit comprises a transistor-based H bridge as a class D amplifier.

9. The method of claim 8 wherein driving the earbud speaker by the current source drive is during smaller amplitudes of an audio signal, and driving the earbud speaker by the voltage source drive is during larger amplitudes of the audio signal.

10. The method of claim 8 wherein driving the earbud speaker comprises controlling a plurality of transistors in the transistor-based H bridge so that the H-bridge is operating in a discontinuous operation mode with charge-delivering current pulses.

11. The method of claim 7 wherein driving the earbud speaker by the current source drive is during smaller amplitudes of an audio signal, and driving the earbud speaker by the voltage source drive is during larger amplitudes of the audio signal.

12. A method of operating an audio amplifier to drive an earbud speaker, the method comprising:
    driving the earbud speaker, as a load, from an amplifier circuit that is configured into a first amplifier mode in which the amplifier circuit has lower output impedance than in a second amplifier mode, wherein the amplifier circuit has voltage source drive in the first amplifier mode for larger amplitudes of an audio signal; and
    driving the earbud speaker, as the load, from the amplifier circuit that is configured into the second amplifier mode, wherein the amplifier circuit has current source drive in the second amplifier mode for smaller amplitudes of the audio signal.

13. The method of claim 12 wherein driving the earbud speaker from the amplifier circuit comprises driving from a class D amplifier having a transistor-based H bridge.

14. The method of claim 12 wherein driving the earbud speaker from the amplifier circuit attenuates electromagnetically coupled noise of the earbud speaker greater during high output impedance than when driving the earbud speaker during low output impedance.

15. The method of claim 12 wherein driving the earbud speaker from the amplifier circuit comprises controlling on and off times of transistors in a transistor-based H bridge to vary magnitude of current and charge delivered to the earbud speaker in accordance with the audio signal, the method further comprising
    varying the amplifier circuit between lower output impedance and higher output impedance by controlling a duty cycle in the transistor-based H bridge of a duration of a charge-delivering current pulse to the load relative to a repetition rate of such pulses, wherein the duty cycle during the higher output impedance is lower than during the lower output impedance and results in the higher output impedance.

16. The method of claim 12 wherein driving the earbud speaker comprises controlling a plurality of transistors in a transistor-based H bridge to vary magnitude of current and charge to deliver to the earbud speaker in accordance with the audio signal, and wherein a duty cycle of charge-delivering current pulses is controlled relative to a repetition rate of the charge-delivering current pulses, to control effective output impedance of the transistor-based H bridge, and to set the duty cycle lower to achieve the higher output impedance of the transistor-based H bridge for smaller amplitudes of the audio signal and the duty cycle higher to achieve the lower output impedance for larger amplitudes of the audio signal.

\* \* \* \* \*